United States Patent [19]

Weisman

[11] Patent Number: 4,975,073
[45] Date of Patent: Dec. 4, 1990

[54] INSERTION AND EXTRACTION AID FOR PRINTED CIRCUIT CARD

[75] Inventor: Arnold M. Weisman, Glendora, Calif.

[73] Assignee: Calmark Corporation, San Gabriel, Calif.

[21] Appl. No.: 310,231

[22] Filed: Feb. 13, 1989

[51] Int. Cl.⁵ .............................................. H01R 13/62
[52] U.S. Cl. ..................................... 439/157; 439/153
[58] Field of Search ............................... 439/152–160, 439/372, 326, 327, 328, 64; 361/395, 399, 412, 415; 403/16, 321

[56] References Cited

U.S. PATENT DOCUMENTS

| | | | |
|---|---|---|---|
| 3,451,034 | 6/1969 | Beale | 439/157 |
| 4,232,926 | 11/1980 | Inouye et al. | 439/157 |
| 4,233,646 | 11/1980 | Leung et al. | 439/160 |
| 4,632,588 | 12/1986 | Fitzpatrick | 439/157 |
| 4,648,009 | 3/1987 | Beun et al. | 439/160 |

Primary Examiner—David L. Pirlot
Attorney, Agent, or Firm—Spensley Horn Jubas & Lubitz

[57] ABSTRACT

A device for aiding insertion of a printed circuit card into, and removal of the card from, a receptacle, the card having electrical connectors along a first edge and the receptacle having a control member located to be adjacent a second edge of the card, opposite the first edge, when the card is inserted in the receptacle, the device comprising: an insertion-extraction lever pivotally mountable on the card at a pivot axis located between first and second arms of the lever, for pivotable movement between locking and extraction positions, the first lever arm being formed to cooperate with the control member when the card is inserted in the receptacle such that movement of the lever into the locking position causes the first lever arm to engage the control member to lock the card in the inserted position, and movement of the lever toward the extraction position causes the first lever arm to cooperate with the control member to move the card in a direction for removal from the receptacle; a catch mountable on the card adjacent the second edge at a location spaced from the pivot axis of the lever; and a latch member pivotally mounted to the second lever arm to positively engage the catch when the lever is in the locking position, the latch member being pivotable relative to the lever to a release position in which the latch member disengages from the catch.

23 Claims, 1 Drawing Sheet

INSERTION AND EXTRACTION AID FOR PRINTED CIRCUIT CARD

BACKGROUND OF THE INVENTION

The present invention relates to a device which is mountable on a printed circuit card and which can be manually operated to aid in inserting a printed circuit card into a receptacle and locking the card in place, and to aid in extracting the card from the receptacle.

It is common practice to provide circuitry for electronic equipment, such as personal computers, on printed circuit cards, or boards, which cards have electrical connectors along one edge and are inserted into receptacles provided in the equipment so that the connectors disposed along one edge of the card mate with connectors permanently installed in the equipment.

It is essential that the card be inserted in a receptacle so as to reach an accurately defined end, or fully inserted, position, in order to assure that a reliable electrical contact is established between all connectors, or terminals, on the card and those permanently installed in the equipment. This generally requires the application of a certain level of force to the card.

Further, if a card must be removed for any reason, a certain extraction force is required and it may prove difficult to manually grip the card in a manner to achieve such extraction force, particularly when a small spacing exists between the card to be extracted and adjacent cards or other equipment components.

Devices which can be attached to a printed circuit card in order to assist in the insertion and removal operations are already on the market. One such device is marketed by the Calmark Corporation of San Gabriel, Calif., under the designation Series 107-20 Card Inserter-Extractor. Two such devices are typically mounted at opposite corners at the edge of a card which is remote from the electrical connectors. Each device cooperates with a support member fixed to the equipment in such a manner that when the device is moved to a locking position, the card is urged into its fully seated position and is locked in that position, while if the device is moved to an extraction position, the card is urged out of engagement with the connectors permanently installed in the equipment, after which the card can easily be withdrawn. The device allows a card to be reliably seated in its fully inserted position and to be easily removed without requiring the user to grip the card itself.

These known devices include a molded detent structure which engages a pin secured to the card in order to hold the device in its locking position and a certain force must be applied to the device to overcome the detent holding force when it is desired to effect card extraction. While this arrangement provides a good locking effect, the detent connection can be inadvertently released, which would result in movement of the device out of its locking position. If this should occur, the card may be caused to move away from its fully inserted position, for example as a result of vibrations occurring within the equipment or accidental contact with the card, with the result that contact between some or all of the connectors on the card and those permanently installed in the equipment can be broken.

SUMMARY OF THE INVENTION

It is a primary object of the present invention to reliably prevent inadvertent movement of such a device from its locking position.

A more specific object of the invention is to provide an improved insertion-extraction aid which is positively maintained in its locking position and which has a high resistance to undesired movement out of its locking position.

Yet another object of the invention is to provide a device of this type which can easily be moved from its locking position, when desired, by the application of a relatively small manual force.

The above and other objects are achieved, according to the present invention, by a device for aiding insertion of a printed circuit card into, and removal of the card from, a receptacle, the card having opposed first and second edges and electrical connectors along the first edge, and the receptacle having a control member located to be adjacent the second edge of the card when the card is inserted in the receptacle, which device comprises: support means mountable on the card adjacent the second edge at a location which will be proximate to the control member when the card is inserted in the receptacle, the support means providing a pivot axis which is transverse to the direction of insertion movement of the card in the receptacle; an insertion-extraction member in the form of a lever having first and second lever arms and pivotally mountable on the support means so that the pivot axis is located between the said first and second lever arms, the insertion-extraction member being pivotable about the pivot axis between a locking position and an extraction position, the first lever arm being formed to cooperate with the control member when the card is inserted in the receptacle such that movement of the insertion-extraction member into the locking position causes the first lever arm to engage the control member to lock the card in the inserted position, and movement of the insertion-extraction member toward the extraction position causes the first lever arm to cooperate with the control member in a manner to move the card in a direction for removal from the receptacle; means defining a catch mountable on the card adjacent the second edge at a location spaced along the second edge from the support means; and a latch member pivotally mounted to the second lever arm to engage the catch when the insertion-extraction member is in the locking position, the latch member being pivotable relative to the insertion-extraction member between a positive latching position in which the latch member positively engages the catch, when the insertion-extraction member is in the locking position, and a release position in which the latch member disengages the said catch.

DESCRIPTION OF THE PREFERRED EMBODIMENTS

Figure 1:
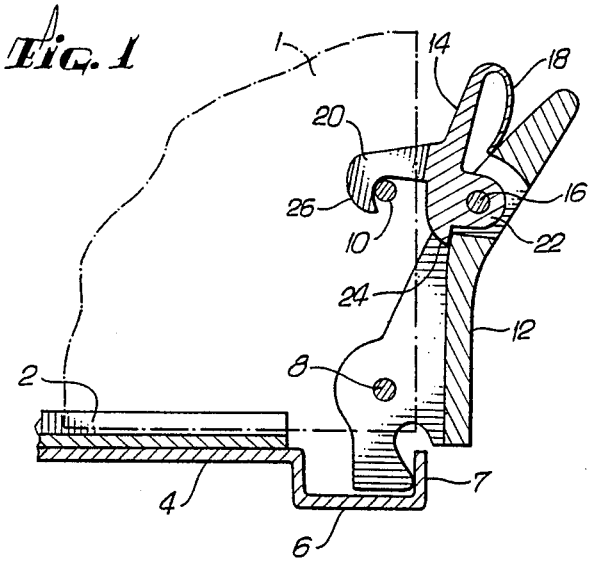
FIG. 1 is a cross-sectional view of a preferred embodiment of a device according to the present invention together with associated card receptacle parts.

FIG. 1 is a cross-sectional view taken along the median plane of the illustrated device and illustrates, in broken lines, a corner region of a printed circuit card 1 installed in a channel 2 of a piece of electronic equipment. At the bottom of channel 2, there is mounted a plate 4 having, at its outer end, a U-shaped channel 6 whose vertical free edge 7 defines a control member. The vertical card edge shown in FIG. 1 is that edge of the card which is remote from the connectors carried by the card. Card 1 is provided with through holes into which are inserted a pivot pin 8 and a latching pin 10.

A member 12 in the form of a two-armed lever is pivotally mounted on pin 8 so that a first arm of the lever extends downwardly from pin 8 and a second arm of the lever extends upwardly therefrom. The first lever arm is formed to have operating surfaces which cooperate with control member 7 in a manner such that when lever 12 is in the position illustrated, card 1 is locked in its fully inserted position and when lever 12 is pivoted clockwise from the position illustrated in FIG. 1, the first lever arm cooperates with control member 7 to move card 1 to the right, out of its fully inserted position.

The second lever arm constitutes an operating member for manually moving lever 12 between the two above-described positions.

According to the invention, lever 12 carries a latch member 14 which is pivotally connected to lever 12 by means of a pivot pin 16. Latch member 14 is provided, at one end, with an integrally formed biassing spring 18, in the form of a leaf spring, and, at its other end, with a latch hook 20 which positively engages, i.e., latches onto, pin 10 when lever 12 and member 14 are in the positions illustrated in FIG. 1, these being the locking position of lever 12 and the positive latching position of latch member 14. The free end of spring 18 bears against the second arm of lever 12 to urge latch member 14 into the positive latching position illustrated. As long as latch member 14 is in the position illustrated in FIG. 1, a substantial force would have to be applied to lever 12 to inadvertently pivot it out of its locking position.

When it is desired to extract card 1 from its receptacle, the free end of the second lever arm of lever 12 and the upper end of latch member 14 can be pressed together manually to move latch hook 20 away from pin 10, i.e., to the release position of latch member 14, whereupon only a small force is required to pivot lever 12 into its extraction position.

The pivotal connection between latch member 14 and lever 12 is provided at an ear 22 which is integral with latch member 14 and which extends into a recess formed in lever 12. Ear 22 carries an abutment element 24 which cooperates with a crosspiece of lever 12 to define one end position of latch member 14 relative to lever 12. This assures that when lever 12 is moved from its extraction position to its locking position, latch member 14 will be held in a position which assures that pin 10 will engage a camming surface 26 associated with latch hook 20 in a manner to assure that latch hook 20 will be deflected over pin 10 in order to reach its positive latching position when lever 12 arrives at its locking position.

Figure 2:
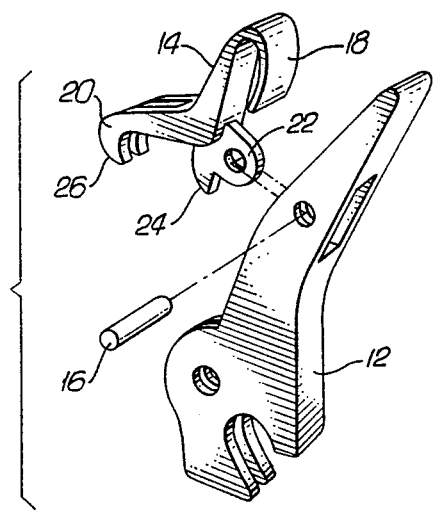
FIG. 2 is an exploded perspective view of the embodiment shown in FIG. 1.

Various details of lever 12 and latch member 14 are apparent in FIG. 2.

As FIGS. 1 and 2 show, portions of lever 12 and latch member 14 are bifurcated in order to straddle card 1. Pins 8 and 10 project from both sides of card 1 to engage parts of lever 12 and latch member 14 which are located to both sides of card 1.

When lever 12 is to be moved from the position shown in FIG. 1 to its extraction position, it is only necessary to manually engage a first actuation region on the outer surface of the second lever arm of lever 12 and a second actuation region on the outer surface of the upper portion of latch 14 in order to pivot latch 14 in a clockwise direction about pivot pin 16, to thereby move latch hook 20 to its release position, in which it is out of engagement with pin 10. Then, continued finger pressure on the actuation region of the outer surface of latch member 14 will pivot lever 12 clockwise about pin 8 in order to move lever 12 to its extraction position. During this movement, the first lever arm presses against member 7 to force card 1 away from its fully inserted position.

Generally, a second assembly identical to that shown in FIG. 1 will be mounted on card 1 at the upper end of the right-hand edge of card 1, that assembly being inverted relative to the assembly shown in FIG. 1.

It has been found that the device according to the present invention provides an improved locking action in that latch member 14, unless properly actuated as described above, can resist opening forces in excess of 50 pounds.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A device for aiding insertion of a printed circuit card into, and removal of the card from, a receptacle, the card having opposed first and second edges and electrical connectors along the first edge and the receptacle having a control member located to be adjacent the second edge of the card when the card is inserted in the receptacle, said device comprising:

support means mountable on the card adjacent the second edge at a location which will be proximate to the control member when the card is inserted in the receptacle, said support means providing a first pivot axis which is transverse to the direction of insertion movement of the card in the receptacle;

an insertion-extraction member in the form of a lever having first and second lever arms and pivotally mountable on said support means so that said first pivot axis is located between said first and second lever arms, said insertion-extraction member being pivotable about said first pivot axis between a locking position and an extraction position, said first lever arm being formed to cooperate with the control member when the card is inserted in the receptacle such that movement of said insertion-extraction member into said locking position causes said first lever arm to engage the control member to lock the card in the inserted position, and movement of said insertion-extraction member toward said extraction position causes said first lever arm to cooperate with the control member in a manner to move the card in the direction for removal from the receptacle;

means defining a catch mountable on the card adjacent the second edge at a location spaced along the second edge from said support means;

a latch member pivotally mounted about a second pivot axis to said second lever arm to engage said catch when said insertion-extraction member is in said locking position, said latch member being pivotable relative to said insertion-extraction member between a positive latching position in which said latch member positively engages said catch, when said insertion-extraction member is in said locking position, and a release position in which said latch member disengages from said catch; and resilient biasing means cooperating with said insertion-extraction member for applying a biasing force to said latch member at a position spaced from said second pivot axis, to pivot said latch member toward said catch thereby urging said latch member into said positive latching position.

2. A device as defined in claim 1 wherein said latch member comprises stop means which cooperate with said insertion-extraction member to define said positive latching position of said latch member.

3. A device as defined in claim 1 wherein said insertion-extraction member and said latch member are each made of molded plastic.

4. A device as defined in claim 1 wherein said latch member comprises stop means which cooperate with said insertion-extraction member to define said positive latching position of said latch member.

5. A device as defined in claim 1 wherein said insertion-extraction member and said latch member are each made of molded plastic.

6. A device as defined in claim 1 wherein said biassing means are formed integrally with said latch member.

7. A device as defined in claim 6 wherein said biassing means comprise a leaf spring having a free end which bears against said second lever arm.

8. A device as defined in claim 1 wherein said second lever arm has a first actuation region which is manually engageable for moving said insertion-extraction member toward said locking position.

9. A device as defined in claim 8 wherein said latch member has a second actuation region which is manually engageable for moving said latch member to said release position and for moving said insertion-extraction member toward said extraction position.

10. A device as defined in claim 1 wherein said second lever arm has a first actuation region which is manually engageable for moving said insertion-extraction member toward said locking position.

11. A device as defined in claim 10 wherein said latch member has a second actuation region which is manually engageable for moving said latch member to said release position and for moving said insertion-extraction member toward said extraction position.

12. A device for aiding insertion of a printed circuit card into, and removal of the card from, a receptacle, the card having opposed first and second edges and electrical connectors along the first edge and the receptacle having a control member located to be adjacent the second edge of the card when the card is inserted in the receptacle, said device comprising:

support means mountable on the card adjacent the second edge at a location which will be proximate to the control member when the card is inserted in the receptacle, said support means providing a pivot axis which is transverse to the direction of insertion movement of the card in the receptacle;

an insertion-extraction member in the form of a lever having first and second lever arms and pivotally mountable on said support means so that said pivot axis is located between said first and second lever arms, said insertion-extraction member being pivotable about said pivot axis between a locking position and an extraction position, said first lever arm being formed to cooperate with the control member when the card is inserted in the receptacle such that movement of said insertion-extraction member into said locking position causes said first lever arm to engage the control member to lock the card in the inserted position, and movement of said insertion-extraction member toward said extraction position causes said first lever arm to cooperate with the control member in a manner to move the card in the direction for removal from the receptacle;

means defining a catch mountable on the card adjacent the second edge at a location spaced along the second edge from said support means; and a latch member pivotally mounted to said second lever arm to engage said catch when said insertion-extraction member is in said locking position, said latch member being pivotable relative to said insertion-extraction member between a positive latching position in which said latch member positively engages said catch, when said insertion-extraction member is in said locking position, and a release position in which said latch member disengages from said catch, wherein said latch member comprises resilient biassing means cooperating with said insertion-extraction member for urging said latch member into said positive latching position, said biassing means comprises a leaf spring formed integrally with said latch member and having a free end which bears against said second lever arm.

13. A device for aiding insertion of a printed circuit card into a receptacle, for securing the card in said receptacle, and for aiding removal of the card from said receptacle, said device comprising:

an insertion-extraction member in the form of a lever having first and second lever arms pivotally mountable to the printed circuit card about a first pivot axis located between said first and second lever arms, said insertion-extraction member being pivotable about said pivot between a locking position and an extraction position;

support means mountable on the printed circuit card for providing the pivotal movement of said insertion-extraction member about said first pivot axis;

means defining a catch mountable on the printed circuit card; and a latch member having resilient biassing means pivotally mounted to said second lever arm about a second pivot axis, said resilient biassing means cooperating with said insertion-extraction member to apply a biassing force to said latch member at a location spaced from said second pivot axis and to pivot said latch member by the resilient force thereof so as to cause said latch member to bear against said catch when said insertion-extraction member is in said locking position, said latch member being pivotable relative to said insertion-extraction member between a positive latching position in which said latch member positively engages said catch, when said insertion-extraction member is in said locking position, and a release position in which said latch member disengages from said catch.

14. A device as defined in claim 13 wherein said latch member comprises stop means which cooperate with said insertion-extraction member to define said positive latching position of said latch member.

15. A device as defined in claim 13 wherein said insertion-extraction member and said latch member are each made of molded plastic.

16. A device as defined in claim 13 wherein said latch member comprises stop means which cooperate with said insertion-extraction member to define said positive latching position of said latch member.

17. A device as defined in claim 13 wherein said insertion-extraction member and said latch member are each made of molded plastic.

18. A device as defined in claim 13 wherein said biasing means is formed integrally with said latch member.

19. A device as defined in claim 18 wherein said biassing means comprise a leaf spring having a free end which bears against said second lever arm.

20. A device as defined in claim 13 wherein said second lever arm has a first actuation region which is manually engageable for moving said insertion-extraction member toward said locking position.

21. A device as defined in claim 20 wherein said latch member has a second actuation region which is manually engageable for moving said latch member to said release position and for moving said insertion-extraction member toward said extraction position.

22. A device as defined in claim 13 wherein said second lever arm has a first actuation region which is manually engageable for moving said insertion-extraction member toward said locking position.

23. A device as defined in claim 22 wherein said latch member has a second actuation region which is manually engageable for moving said latch member to said release position and for moving said insertion-extraction member toward said extraction position.

* * * * *